United States Patent [19]
Nishino et al.

[11] Patent Number: 5,126,801
[45] Date of Patent: Jun. 30, 1992

[54] SUPERCONDUCTING DEVICE

[75] Inventors: Toshikazu Nishino, Kawasaki; Mutsuko Miyake, Urawa; Ushio Kawabe, Nishitama; Yutaka Harada, Kodaira; Masaaki Aoki, Minato; Mikio Hirano, Ome, all of Japan

[73] Assignee: Hitachi, Ltd., Tokyo, Japan

[21] Appl. No.: 412,201

[22] Filed: Sep. 25, 1989

Related U.S. Application Data

[63] Continuation of Ser. No. 73,408, Jul. 13, 1987, Pat. No. 4,884,111, which is a continuation of Ser. No. 795,270, Nov. 5, 1985, abandoned.

[30] Foreign Application Priority Data

| | | | |
|---|---|---|---|
| Nov. 5, 1984 | [JP] | Japan | 59-231308 |
| Feb. 20, 1985 | [JP] | Japan | 60-30366 |
| Feb. 25, 1985 | [JP] | Japan | 60-34355 |
| Mar. 11, 1985 | [JP] | Japan | 60-46539 |
| May 24, 1985 | [JP] | Japan | 60-110371 |

[51] Int. Cl.⁵ .................. H01L 39/22; H01L 27/01; H01L 27/02
[52] U.S. Cl. ........................... 357/5; 357/4; 357/23.1; 357/41
[58] Field of Search .............. 357/5.4, 23.1, 41

[56] References Cited

U.S. PATENT DOCUMENTS

| | | | |
|---|---|---|---|
| 4,157,555 | 6/1979 | Gray | 357/6 |
| 4,163,237 | 7/1979 | Dingle et al. | 357/16 |
| 4,575,141 | 3/1986 | Frank | 357/5 |
| 4,589,001 | 5/1986 | Sakai et al. | 357/5 |
| 4,884,111 | 11/1989 | Nishino et al. | 357/5 |

FOREIGN PATENT DOCUMENTS

| | | | |
|---|---|---|---|
| 57-106186 | 7/1982 | Japan | 357/5 |
| 59-103389 | 6/1984 | Japan | 357/5 |
| 59-182586 | 10/1984 | Japan | 357/5 |

OTHER PUBLICATIONS

S. M. Faris et al, "Compact Three-Terminal Josephson Switch", *IBM Technical Disclosure Bulletin*, vol. 24 (Aug. 1981) pp. 1545-1546.
T. D. Clark et al., "Feasibility of Hybrid Josephson Field Effect Transistors", *Journal of Applied Physics*, vol. 51 (May 1980) pp. 2736-2743.

*Primary Examiner*—J. Carroll
*Attorney, Agent, or Firm*—Antonelli, Terry Stout & Kraus

[57] ABSTRACT

A pair of superconducting electrodes are so formed as to interpose a semiconductor therebetween, and a control electrode is formed on the semiconductor through an insulator film so as to control the superconductive weak coupling state in the semiconductor between the superconducting electrodes. The distance between the superconducting electrodes is determined by the thickness of the superconductor interposed between the two electrodes, whereby the interelectrode distance is settled with a high precision to improve the uniformity of the device characteristic. In an arrangement where two superconducting electrodes are formed on a semiconductor layer and the superconductive weak coupling state between such two electrodes is controlled by a third electrode, the gain is incredible by furnishing a varied impurity distribution in the semiconductor layer.

26 Claims, 7 Drawing Sheets

SUPERCONDUCTING DEVICE

This application is a continuation application of application Ser. No. 07/073,408, filed Jul. 13, 1987, U.S. Pat. No. 4,884,112. which is a continuation of application of Ser. No. 06/795,270, filed Nov. 5, 1985 abandoned.

BACKGROUND OF THE INVENTION

The present invention relates to a cryogenic superconducting device designed to operate at cryogenic temperatures and, more particularly, to a superconducting device for controlling the number of superconducting or normal conducting electrons, which tunnel through a semiconductor, by a voltage applied to a control electrode.

In the conventional switching devices operative at cryogenic temperatures, there is known a Josephson device. It has some advantages including a high switching speed and a small power consumption of several microwatts or so. However, this device is basically a two-terminal device, which is therefore not adapted for use in forming a circuit by the prior techniques accumulated in connection with the known semiconductor transistors, and employment of an AC power supply is requisite.

In an attempt to solve the problems mentioned above, a superconducting device has been developed by means of combining a superconductor and a semiconductor, as disclosed in Japanese Patent Laid-open No. 57-106186. In this device, a pair of superconducting layers are deposited on a semiconductor substrate with the respective end faces opposed to each other, and a control conductor is disposed in such opposed portions through an insulator layer. In such prior art, a superconducting layer formed on the semiconductor substrate is separated into two superconducting electrodes by photolithography and etching. Subsequently the portion thus separated is thermally oxidized to form an insulator film, and then a desired control electrode is formed by evaporation. For enabling the two superconductors of such device to interact in superconductive weak coupling through a semiconductor at cryogenic temperatures, it is necessary to dispose the two superconducting electrodes so close to each other that the distance therebetween becomes about 10 times the coherent length of an electron pair of the superconducting electrons, i.e. less than 0.5 microns or so. However, in the conventional structure, it is impossible to facilitate formation of a control electrode in a narrow gap of 0.5 microns or less, whereby the dimensional precision cannot be enhanced in manufacture to eventually bring about difficulties in attaining high reliability and uniformity.

Another known superconducting device composed of a semiconductor with an electrode to control the characteristics thereof is JOFET (Hybrid Josephson Field Effect Transistors) proposed by T. D. Clark as reported in J. Appl. Phys., vol. 51, pp. 2736-2745, 1980. In such JOFET, an electrode of a superconductor is formed on a semiconductor substrate doped to a high concentration, or a dope layer is formed on a high-purity buffer layer and an electrode of a superconductor is formed thereon. In such device, control of its characteristics is executed by applying a voltage to the control electrode and extending the inversion layer from the control electrode side toward the semiconductor side. However, since the impurity concentration is high in the semiconductor layer immediately below the control electrode, the voltage to be applied to the control electrode reaches as high as several hundred millivolts while an output voltage obtainable is approximately equal to or even lower than that. Accordingly, it has been impossible heretofore to use circuits similar to those employed in the prior art of semiconductors.

In addition to the above, there are the following references related to superconducting devices.
1) IEEE Trans. Magn., vol. MAG-15, pp. 435-438. 1979
2) IEEE Trans. Electron Devices, vol. ED-28, pp. 1394-1397, 1981
3) Japanese Patent Laid-open No. 57-176781

SUMMARY OF THE INVENTION

It is an object of the present invention to provide a novel structure of a transistor type superconducting device which is composed of a combination of a semiconductor and a superconductor and is capable of enhancing the manufacturing precision to consequently improve the uniformity and reproducibility of the device characteristics.

Another object of the invention is to provide a superconducting device having a novel structure adapted for high-density integration.

A further object of the invention resides in providing a superconducting device where a parasitic capacity is reducible to enable a high speed operation.

And a still further object of the invention is to provide a superconducting device which retains a great gain in controlling the coupling state between superconducting electrodes by an applied voltage.

The superconducting device of the present invention is constituted as follows.
1) A pair of superconducting electrodes are formed on the two sides of a semiconductor, and a control electrode is disposed on the semiconductor through an insulator film so as to control a superconductive weak coupling state in the semiconductor between the superconducting electrodes.

It is essential that the distance between the superconducting electrodes should be less than 10 times the coherent length $\epsilon n$ of a superconducting electron pair. The manufacturing precision can be enhanced by determining the interelectrode distance in accordance with the thickness of the semiconductor interposed between the superconducting electrodes, whereby the uniformity of the device characteristics can be improved as well.

Determination of the interelectrode distance in accordance with the semiconductor thickness is achieved by first etching a semiconductor substrate to form a projection thereon and then disposing a pair of superconducting electrodes on the two sides of such projection. According to this process, the accuracy of the spatial distance between the superconducting electrodes is dependent on the precision of the semiconductor substrate. Therefore a high manufacturing precision is attainable regardless of any other condition such as the hardness of the superconductor material. It is desired that the height of the projection be equivalent to at least the thickness of the superconducting electrode.

The electrode for controlling the superconductive weak coupling state is formed in an upper or lower portion of the semiconductor projection through an insulator film. It is a matter of course that the control electrode may be provided in each of upper and lower portions. The superconducting device of such structure furnished with a control electrode particularly in an upper portion of the projection is of a planar type adapted for realizing an arrangement of high-density integration.

Reduction of a parasitic capacity is achievable by shaping a channel-defining semiconductor into an insular contour. That is, first an insular semiconductor is formed on one side of the insulator film, then superconducting electrodes are formed in such a manner as to interpose the semiconductor therebetween, and subsequently a control electrode is formed on the other side of the insulator film. The above procedure eliminates the substrate capacity to eventually accomplish a satisfactory superconducting device which is capable of performing a high speed operation. The superconducting device of such structure can be shaped into a planar type with facility so that high-density integration thereof is rendered possible.

2) At least two superconducting electrodes are disposed adjacently to each other on a semiconductor layer (or substrate), and at least one control electrode is formed for controlling current flow between the superconducting electrodes to change the interelectrode superconductive weak coupling. And the distribution of impurities contained in the semiconductor layer is so arranged as to include at least one region of a high impurity concentration above the average and at least one region of a low impurity concentration below the average. Due to such varied concentration distribution of impurities contained in the semiconductor layer that serves as the superconducting electrode, the gain is increasable in controlling the interelectrode coupling state by an applied voltage.

Since the semiconductor layer in the conventional superconducting device contains impurities uniformly at a high concentration, attainable extension of an accumulation layer or inversion layer is relatively small in comparison with the voltage applied to the control electrode. However, in the present invention where the impurities are in a varied distribution, the extension of the charge storage layer or inversion layer is caused in a different manner as compared with that induced in a uniform distribution of impurities, so that application of a lower voltage is sufficient to extend the accumulation layer or inversion layer with facility, hence increasing the gain.

For example, in a preferred embodiment of the present invention where two superconducting electrodes are disposed on one side of a semiconductor layer while a control electrode is disposed on the other side of the semiconductor layer through an insulator layer, the impurity concentration in a semiconductor region proximate to the control electrode is made to be high while the impurity concentration in other semiconductor regions proximate to the superconducting electrodes is made to be low in such a manner that the concentration distribution is formed in the direction of depth of the semiconductor layer. In such impurity distribution, the accumulation layer is extendable readily from the high concentration layer toward the low concentration layer by the application of a low control voltage. Therefore, utilizing the characteristic phenomenon mentioned above, the superconductive weak coupling state can be changed with facility by a low control voltage to eventually bring about an effect of increasing the gain. As for the inversion layer, its extension is not induced easily until the control voltage exceeds a given value (i.e. until the inversion layer extends to the high impurity concentration layer), but upon rise of the voltage to cause extension of the inversion layer to the low impurity concentration layer, desired extension is induced readily even with a subsequent slight rise of the voltage. Consequently, utilization of such characteristic phenomenon realizes a satisfactory superconducting device of a great gain in which the characteristic thereof remains substantially unchanged until arrival of the control voltage at a certain fixed value but is sharply changed upon subsequent excess of the control voltage over the fixed value.

DETAILED DESCRIPTION OF THE INVENTION

Embodiment 1

Figure 1A:
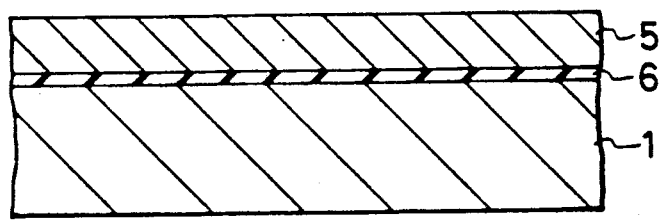
FIG. 1 (a) through (d) are sectional views illustrating the steps of producing a first embodiment of the superconducting device according to the present invention.
Figure 1B:
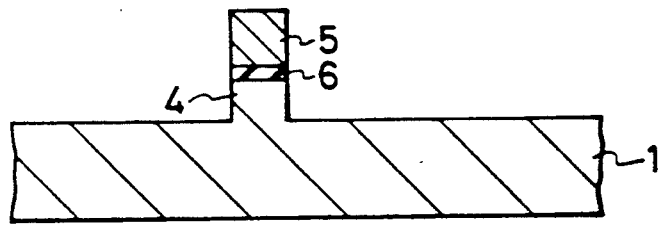
Figure 1C:
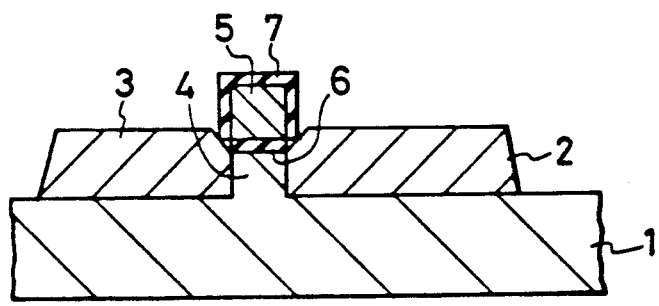
Figure 1D:
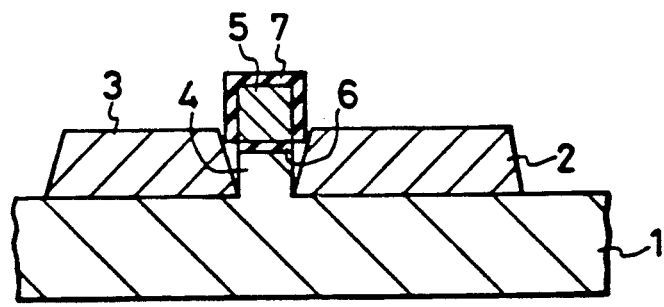

Hereinafter a first embodiment of the present invention will be described with reference to FIG. 1.

FIG. 1 (c) is a sectional view of a superconducting transistor structure according to the present invention, wherein a projection 4 is formed in a portion of a semiconductor substrate 1, and a pair of mutually opposed superconducting electrodes 2 and 3 are disposed on the two sides of the projection 4. And a control electrode 5 with insulated lateral surfaces is disposed on the projection 4 through an insulator layer 6.

In case the semiconductor is made of silicon, a narrow gap of 0.2 microns is kept between the superconducting electrodes 2 and 3. Superconducting electron pairs are emitted from the superconducting electrodes 2 and 3 onto the semiconductor substrate 1 or the projection 4 thereof and then are advanced to flow in the semiconductor interposed between the superconducting electrodes. Such flow of the superconducting electron pairs is controllable by a voltage applied to the control electrode 5.

In this superconducting device, the superconducting electrodes 2 and 3 are coupled to each other by superconducting weak interaction when cooled below the transition temperature of the superconducting electrode material, and the maximum Josephson current Im flowing between the two superconducting electrodes due to such coupling is given by $$Im = 4\pi\Delta/2eR_N$$

where $\Delta$ is gap energy of the superconducting electrodes 2 and 3; e is an elementary charge; and $R_N$ is a normal-conducting tunnel resistance in the superconducting weak coupling. In order to achieve such superconducting weak coupling, it is desired that the gap between the two superconducting electrodes 2 and 3 be smaller than 300 nanometers and the two electrodes be spatially separated from each other.

When a negative or positive voltage is applied to the control electrode 5 with respect to the superconducting electrode 2 or 3, a positive or negative charge is induced on the semiconductor side of the interface between the semiconductor and the insulator film 6, so that the state of a tunnel barrier is altered with such charge to eventually vary the resistance $R_N$ to a greater value, hence reducing the maximum Josephson current Im which is permitted to flow between the electrodes 2 and 3 without causing generation of a voltage.

The steps of producing this device will now be described below with reference to FIG. 1 (a) through (d). First a substrate 1 composed of single-crystal silicon is oxidized for an hour in a steam-containing oxygen atmosphere at 1200° C. to form thereon an insulator layer 6 of $SiO_2$ having a thickness of 80 nanometers, and then a control electrode 5 of polycrystal silicon is formed to a thickness of 0.3 microns by electron beam evaporation in a high vacuum receptacle, as shown in FIG. 1 (a). Subsequently, using an electron beam resist as a mask, plasma etching is executed with $CF_4$ gas to a portion of the substrate 1, as shown in FIG. 1 (b). In the next step, superconducting electrodes 2 and 3 composed of Pb and having a thickness of 300 nanometers are formed by resistance heating evaporation and lift-off. In this step, the superconducting electrodes may be formed in contact with a projection 4 as shown in FIG. 1 (c) or may be formed separately therefrom as shown in FIG. 1 (d). And finally the lateral surface of the control electrode 5 is thermally oxidized to form an insulator layer 7 thereon.

A material suitable for such insulator layers 6 and 7 may be selected from SiO, $Si_3N_4$ and $Al_2I_3$ in addition to the aforesaid $SiO_2$. As for the semiconductor, its material may be Si or Ge containing an impurity such as P, B or As at a concentration higher than $10^{19}$ cm$^{-3}$; or GaAs, InAs or InP containing an impurity such as Si, Zn or Ge at a concentration higher than $10^{17}$ cm$^{-3}$. The control electrode 4 may be composed of Ti, W, Mo, PolySi, Al, Cu or Pt as well.

And a material for the superconducting electrodes 2 and 3 may be Pb or Pb-based alloy (e.g. Pb-Au, Pb-In, Pb-Au-In or Pb-Bi); or Nb or its compound (e.g. NbN, $Nb_3Al$, $Nb_3Ge$ or $Nb_3Sn$).

In the superconducting transistor thus produced, the projection 4 serving as a channel layer can be easily formed with a high accuracy to have a dimension (approx. 0.5 microns or less although different depending on the semiconductor material, impurity concentration and other condition) which is about 10 times the coherent length of an electron pair of the superconducting electrons.

Due to the high precision attained with respect to the spatial distance between the superconducting electrodes, it becomes possible to minimize the characteristic variation as well as to achieve a high yield rate in manufacture.

Furthermore, relative to the principle of operation based on the phenomenon that the superconducting weak coupling state between the two superconducting electrodes 2 and 3 is changed by a voltage applied to the control electrode 4, any malfunction is preventable in this exemplary embodiment where the insulator layer 7 is formed around the control electrode 4 to ensure interelectrode separation.

Since the superconducting electrodes 2 and 3 are disposed opposite to each other, current flow therebetween is rendered ready to bring about a higher operation speed in the superconducting transistor.

In addition, a self-align process is applicable to eventually reduce the number of masks and that of steps required, hence facilitating the manufacture in view of the process.

Embodiment 2

Figure 2:
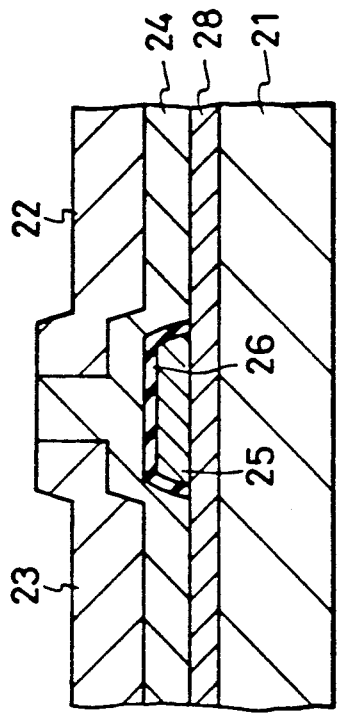
FIG. 2 is a sectional view of a second embodiment of the superconducting device according to the invention.

In a second embodiment of the present invention shown in FIG. 2, a control electrode 25 composed of niobium and having a thickness of 200 nanometers and a width of 10 microns is formed on a substrate 21 of single-crystal silicon which is covered with an oxide film 28 of 0.7 microns in thickness, and the surface of the control electrode 25 is oxidized to form an insulator film 26 thereon. Subsequently a semiconductor layer 24 composed of polycrystal line or amorphous silicon and having a thickness of 300 nanometers is formed by electron beam evaporation in a high vacuum receptacle, and the semiconductor 24 is etched partially or entirely by the same method as employed for the first embodiment with an electron beam resist used as a mask. It is desired that the etching be executed in a depth equivalent to at least the thickness of superconducting electrodes 22 and 23 which are to be formed in the next step. The superconductor layer is composed of niobium and measures 200 nanometers in thickness. In the case of using a slow-etchable material such as niobium or a compound thereof, it is not exactly easy to attain a high dimensional precision because of deformation of the resist material or the like during the etching. However, according to the method mentioned above, the precision of the spatial distance between the two superconducting electrodes is determined regardless of the superconductor material and merely by the manufacturing precision of the semiconductor substrate, hence not dependent on any other condition such as the hardness of the superconductor material. Consequently, even when the superconductor material is changed from Pb alloy to Nb or its compound, high-precision processing can be performed to ensure remarkable uniformity in the device characteristic, whereby a high yield rate is attainable in manufacture.

Embodiment 3

Figure 11:
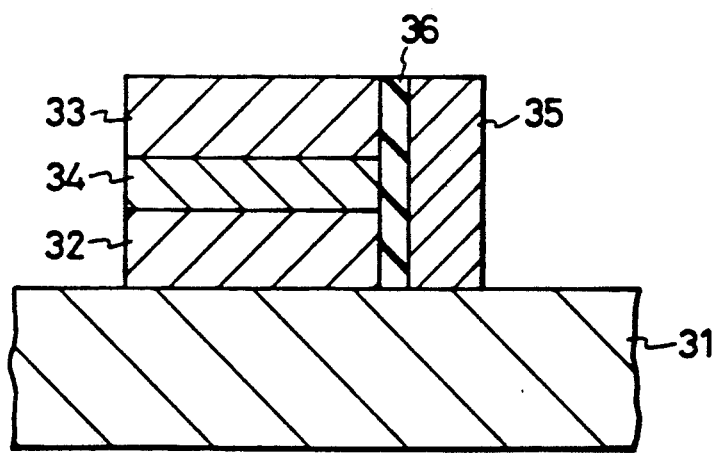
FIG. 11 is a sectional view of a third embodiment of the superconducting device according to the invention.

Immediately after a thin film 32 of niobium is deposited to a thickness of 300 microns on a substrate 31 by DC magnetron sputtering, a channel layer 34 composed of silicon and having a thickness of 200 nanometers is formed thereon by vapor-phase growth or molecular beam growth, and boron is introduced as an impurity at a concentration of $10^{19}$ cm$^{-3}$ by ion implantation. Then a thin film 33 of niobium having a thickness of 300 nanometers is deposited again to constitute a laminated structure, which is subsequently processed by ion etching with a photoresist used as a mask to obtain a desired shape. In the next step, the surface of the lateral wall is thermally oxidized for 10 minutes in an oxygen atmosphere at 1000° C., thereby forming an insulator film 36 of about 20 nanometers in thickness. And finally niobium is deposited to a thickness of 800 nanometers by DC magnetron sputtering Posterior to the above, reactive ion etching is executed with $CF_4$ gas in such a manner as to leave niobium of 2 microns in width on the right side of the thermally oxidized film, whereby a third electrode 35 is obtained. The superconducting transistor of this embodiment shown in FIG. 11 is thus manufactured by the above procedure.

According to this embodiment where the thickness of the semiconductor is utilized to determine the distance between the superconducting electrodes, accurate control can be performed to minimize variation in the transistor characteristic as well as to raise the yield rate in manufacture. Furthermore, an interlayer insulator film is not necessary to bring about an advantageous effect of facilitating the production steps. And a composite device can be constituted with facility by connecting a plurality of such superconducting transistors in series to obtain a greater output amplitude.

Embodiment 4

Figure 3:
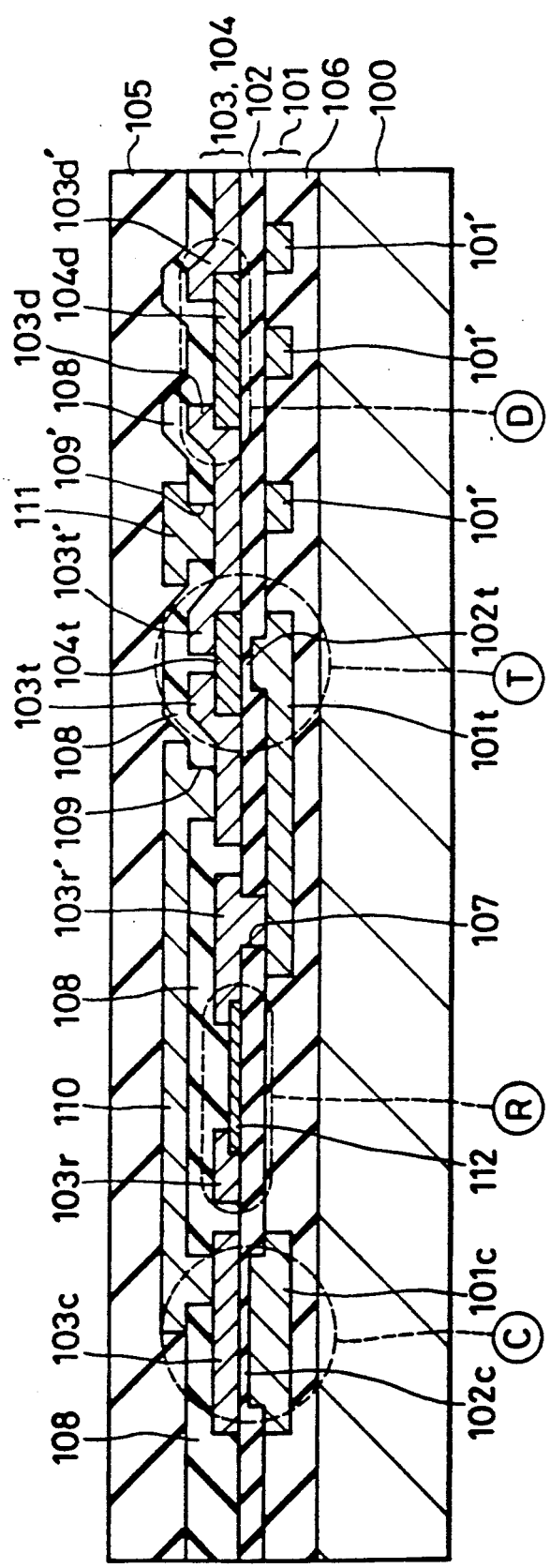
FIG. 3 is a sectional view of a fourth embodiment of the superconducting device according to the invention.
Figure 4A:
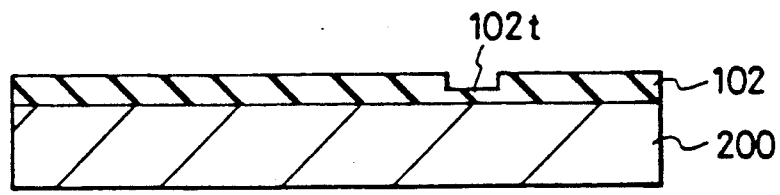
FIG. 4 (a) through (i) are sectional views illustrating the steps of producing a fourth embodiment of the superconducting device according to the invention.
Figure 4B:
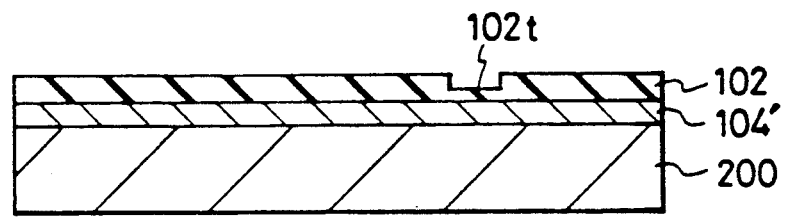
Figure 4C:
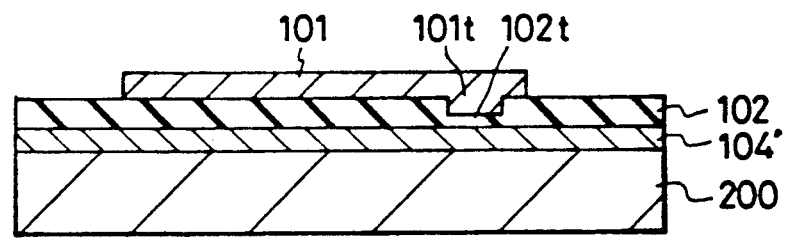
Figure 4D:
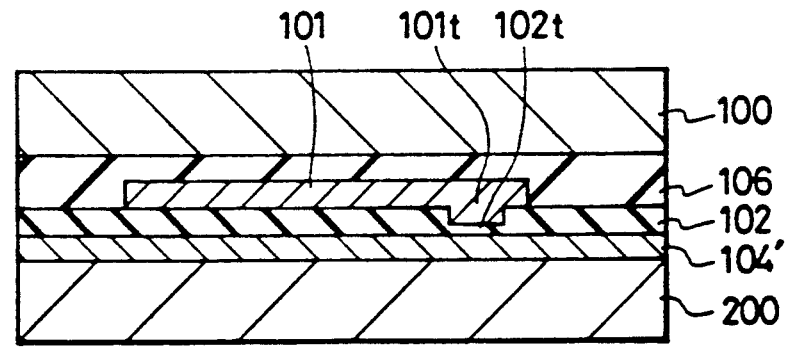
Figure 4E:
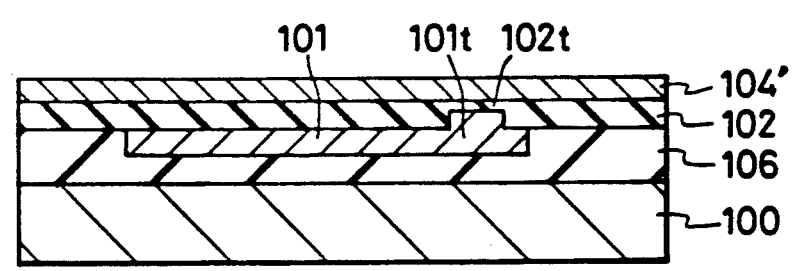
Figure 4F:
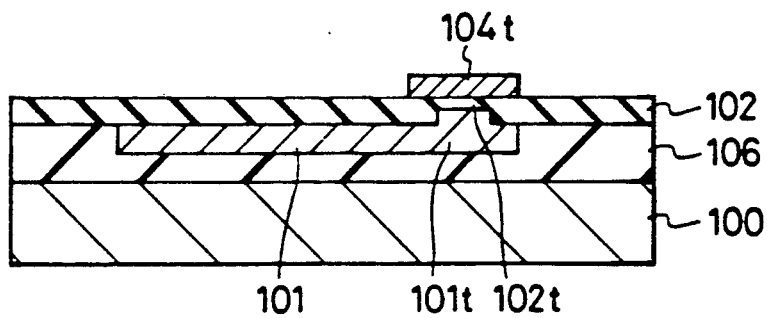
Figure 4G:
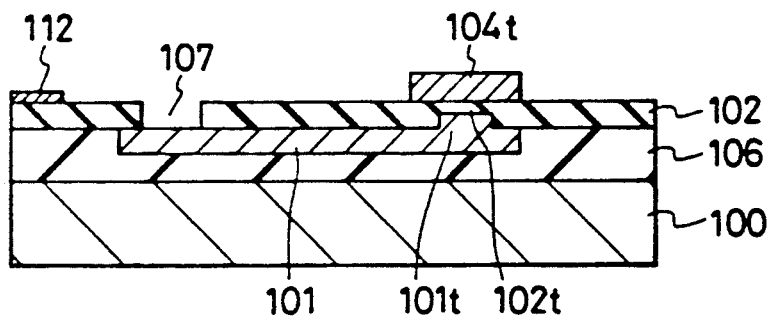
Figure 4H:
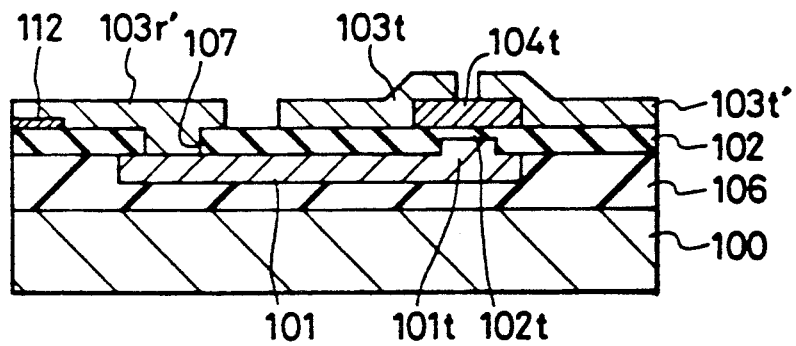
Figure 4I:
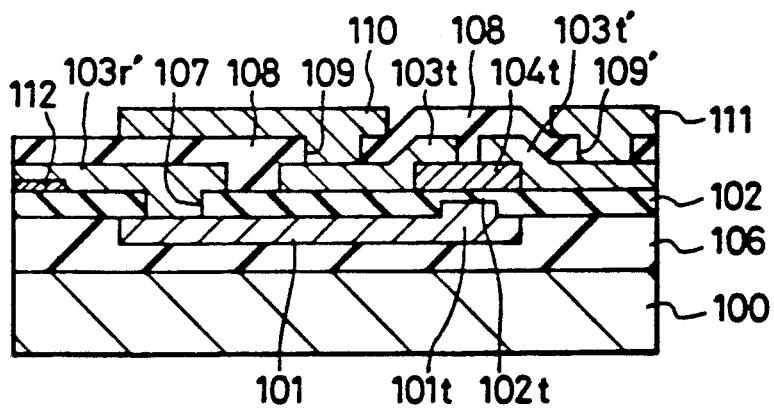

FIG. 3 is a sectional view of a superconducting integrated circuit which is a fourth embodiment of the present invention. In this example, component elements including a superconducting device T, a diffused resistor D, a metal thin film resistor R and an electrostatic capacitor C are integrated on a single substrate. Basically this integrated circuit is constituted of thin film structure which comprises a substrate 100 for mounting component elements thereon, a metal film 101 or a semiconductor film containing an impurity introduced therein and serving as a wiring layer, an insulator film 102 formed on the metal film 101, a superconducting metal 103 located on the insulator film 102, and an insular semiconductor thin film 104. A material for the substrate 100 is selected from an inorganic substance such as single-crystal or polycrystal line silicon and an organic substance such as resin. The metal film 101 is composed of a stable material such as Al or Au, or a superconducting metal. The insulator film 102 is composed of an insulating substance such as resin or silicon compound typically represented by silicon oxide (e.g. $SiO_2$ or SiO) or silicon nitride. As for the superconducting metal 103, a Pb-based or Nb-based metal is used. The semiconductor thin film 104 is usually composed of Si, Ge, GaP, GaAs, GaSb, InP, InAs or InSb. It is preferred that any of such substances be a single-crystal, but polycrystal or amorphous one is usable as well. An impurity is contained in this semiconductor thin film at a concentration of $10^{19}$ to $10^{20}$ cm$^{-3}$. When the semiconductor material is Si, for example, an impurity typically used is B, P or As. There are further formed in this embodiment a protection film 105 for protecting the above-mentioned component elements, and an insulator film 106 for isolating from the substrate 100 the metal film 101 which serves as a wiring layer. In case the substrate 100 is composed of any material that becomes an insulator at very low temperatures, the insulator film 106 is dispensable.

Now a description will be given on the structure of the superconducting device T which is a fundamental element in constituting the superconducting integrated circuit of the present invention. In the superconducting device T, a gate insulator film 102t is formed in a thin portion obtained by selectively reducing the thickness of an insulator film 102, and a metal film 101 proximate to the substrate 100 is processed to serve as a gate electrode 101t. An insular semiconductor thin film 104 on the gate insulator film 102t is formed into a channel layer 104t, and a superconducting metal 103 so shaped as to cover the semiconductor thin film 104t while holding it from two sides is processed to become superconducting electrodes 103t and 103t' which are spaced apart from each other by a narrow gap of 0.2 microns or so. The gate electrode 101t is connected to a metal film 103t' formed on the insulator film 102 via a through-hole 107 in the insulator film 102 and is thereby connected to other component elements. The superconducting electrodes 103t and 103t' are connected respectively to metal films 110 and 111 which are formed on the insulator film 108 via through-holes 109 and 109' in the insulator film 108 located on both the superconducting metal 103 and the semiconductor thin film 104, whereby the superconducting electrodes 103t and 103t' are connected to other component elements. The superconducting device T thus constituted with a semiconductor thin film furnished separately from the substrate to serve as a channel layer is of a planar structure adapted for high-density integration and easily integrable with other elements as well.

The diffused resistor D integrated on the substrate together with the superconducting device T comprises a semiconductor thin film 104d formed on the insulator film 102 and metal films 103d and 103d' which serve as electrode films connected to the two ends of the semiconductor thin film 104d, wherein the metal film 103d is connected also to the superconducting electrode 103t'.

The metal thin film resistor R is so formed that metal films 103r and 103r' serving as electrode films are connected to two ends of the metal resistor thin film 112. A material suitable for the metal resistor thin film is a normal conducting metal such as a compound or alloy of Au, Ag, Mo, Cr, Al, Ta, Nb or W.

The electrostatic capacitor C is constituted by forming metal films 103c and 101c as electrodes above and below a portion 102c obtained by selectively reducing the thickness of the insulator film 102. The metal film 101' is used for wiring. In this manner, the above-mentioned substrate 100, metal film 101, insulator film 102, superconducting metal film 103 and insular semiconductor thin film 104 function as basic elements to constitute a superconducting integrated circuit, whereby the entire components including the superconducting device can be arranged on the surface of the substrate, hence realizing high-density integration. Furthermore, since this embodiment has an ideal structure where the entire components are embedded in the insulator film, the parasitic capacity can be reduced to eventually bring about another advantage of fast device operation.

Now exemplary steps of producing the superconducting device T, which is a fundamental component in the superconducting integrated circuit of FIG. 3, will be described with reference to FIG. 4.

First an oxide layer serving as an insulator film 102 is formed on a substrate 200 of single-crystal silicon and is selectively thinned to shape a portion corresponding to a gate insulator film 102t. This film is producible by thermally oxidizing the surface of the single-crystal silicon to form a thick oxide film, then etching such oxide film selectively, and subsequently processing it to a thin oxide film to obtain a desired film structure. In this embodiment, the insulator film 102 is shaped to have a thickness of 200 nanometers, and the gate insulator film is shaped to have a thickness of 20 nanometers [FIG. 4 (a)]. In the next step, boron is introduced by ion implantation so as to be contained at a concentration of $10^{19}$ cm$^{-3}$, whereby a channel layer 104' is formed to serve as an insular semiconductor thin film 104 [FIG. 4 (b)]. Subsequently a metal film 101 is formed to a thickness of 300 nanometers, thereby producing a gate electrode 101t [FIG. 4 (c)]. Furthermore an insulator film 106 and a substrate 100 are superposed thereon in a laminated structure. In this embodiment, the substrate 100 is dimensionally so selected as to have a thickness of 200 microns or so [FIG. 4 (d)]. In the state mentioned, the substrate 200 of single-crystal silicon is processed by etching from its reverse side in such a manner that merely the regions of a low impurity concentration are etched by utilizing the anisotropic etching property of silicon, whereby only a channel layer 104' of a high impurity concentration can be left. In this embodiment, the channel layer 104' is processed to have a thickness of 100 nanometers by the aforesaid ion implantation and the above etching. It is to be noted here that, in this stage of production, the channel layer 104' is on the obverse side [FIG. 4 (e)]. Subsequently the channel layer 104' is processed by selective etching to form a portion corresponding to a channel layer 104t of the superconducting device T [FIG. 4 (f)]. In the next step, the insulator film 102 is selectively etched to form a through-hole 107, and further a metal resistance thin film 112 is formed [FIG. 4 (g)]. Then a metal film of 300 nanometers in thickness is formed to produce a metal film 103r' which is connected to the gate electrode 102t, and also superconducting electrodes 103t and 103t'. The gap between these two electrodes 103t and 103t' is established to be 200 nanometers [FIG. 4 (h)]. After the above procedure, an insulator film 108 is produced with through-holes 109 and 109' formed selectively. On the insulator film 108, metal films 110 and 111 are formed in connection to the superconducting electrodes 103t and 103t', respectively. Desired shapes thereof are obtained by the art of lift-off and etching [FIG. 4 (i)]. And finally a protection film 105 is formed to finish constituting the superconducting device T which is a fundamental component of the superconducting integrated circuit shown in FIG. 3. It is to be understood that the steps illustrated in FIG. 4 are typical examples, and the superconducting integrated circuit of FIG. 3 can also be manufactured by altering the sequence of such steps or by employment of some other method. For example, the channel layer 104' can be formed by executing the ion implantation of FIG. 4 (b) prior to forming the insulator film 102 of FIG. 4 (a). In another modification, the ion implantation may be selectively executed in FIG. 4 (b), and an insular film of single-crystal silicon corresponding to the channel layer 104t is formable directly when the substrate 200 of single-crystal silicon is etched in FIG. 4 (e). In addition, the art of MBE or laser annealing may be applied to formation of the channel layer 104t.

Embodiment 5

Figure 5A:
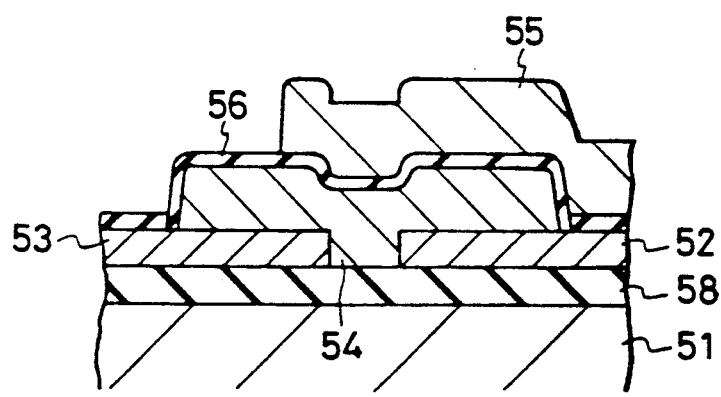
FIG. 5 (a) and (b) are a sectional view and a front view, respectively, of a fifth embodiment of the superconducting device according to the invention.
Figure 5B:
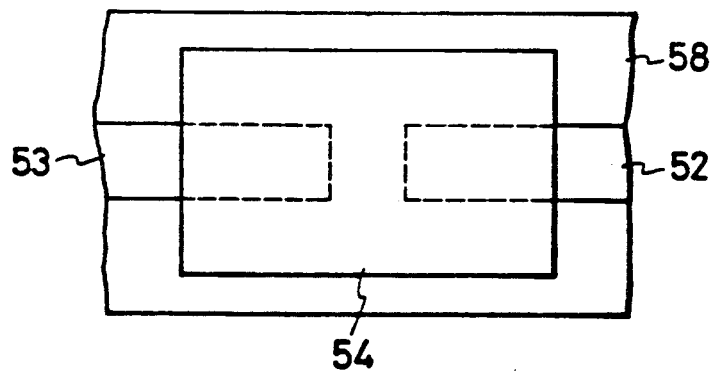

In this embodiment, as shown in FIG. 5 (a), a superconducting device is constituted by first forming electrodes 52 and 53 of a superconductor on either a substrate 51, which becomes an insulator at cryogenic temperatures, or an insulator film 58 provided previously on the substrate 51, then forming a semiconductor layer 54 on the electrodes 52 and 53, further forming an insulator layer 56 thereon, and finally forming a control electrode 55 on the insulator layer.

The semiconductor layer, where a superconducting or normal conducting current flows, is electrically isolated from the substrate so that no substrate capacity is existent therein. Accordingly it becomes possible to increase the switching speed in the circuit operation. Since a high resistance material is usable for the substrate, the necessity of providing particular means to separate the components from one another can be eliminated when arraying a multiplicity of superconducting devices on the substrate.

A heat treatment is effective for improving the crystalline and electrical properties of the semiconductor layer. In this case, however, there arises a problem that deterioration may be induced in the superconductivity of the superconductor located under the semiconductor layer. As a result of the studies accomplished by the present inventors, it has been confirmed that such deterioration in the characteristic of the superconductor under the semiconductor layer is preventable despite a heat treatment of the semiconductor layer if any of NbN, Nb$_3$Si, Nb$_3$Ge, MoN and V$_3$Si is used as a material for the superconductor. This discovery permits a heat treatment of the semiconductor layer without raising the aforementioned problem, hence enabling single-crystallization of the [100] face principally by, for example, increasing the crystal grain diameter in the semiconductor or recrystallizing it to consequently improve the characteristic of the superconducting device.

Single-crystallization of the [100] face is achievable by forming the semiconductor layer astride the superconductor and the insulator film, as shown in FIG. 5 (b).

Embodiment 6

Figure 6:
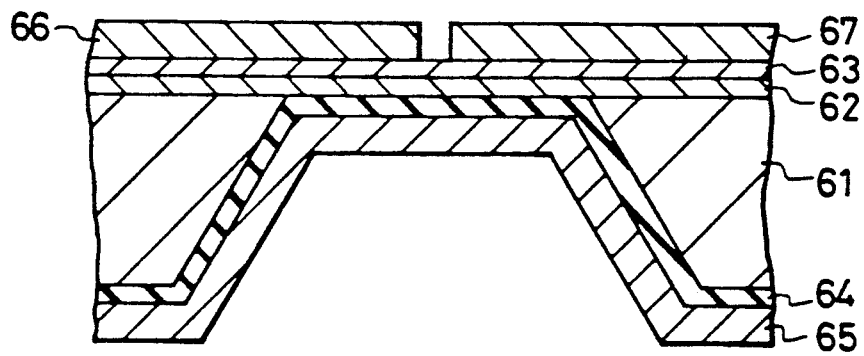
FIG. 6 is a sectional view of a sixth embodiment of the superconducting device according to the invention.

A sixth embodiment of the present invention is shown in FIG. 6. Boron is introduced into a substrate 61 of single-crystal silicon in the [100] orientation thereof by ion implantation with application of an acceleration voltage of 70 KeV to attain a dose density of $10^{15}$ cm$^{-2}$, and then the substrate 61 is annealed for 35 minutes in a nitrogen atmosphere at 900° C. This treatment produces a high impurity concentration layer 62 having a thickness of about 200 nanometers. After cleaning the surface thereof, a low impurity concentration layer 63 is formed thereon by molecular beam epitaxy or vapor-phase growth in such a manner that boron is contained as an impurity at a concentration of $10^{16}$–$10^{18}$ cm$^{-3}$. The amount of the boron impurity to be contained in the low impurity concentration layer 63 is so selected as to become smaller than the amount in the high impurity concentration layer 62. In case the semiconductor material is silicon, it is preferred that the impurity concentration be about $10^{14}$ to $10^{16}$ cm$^{-3}$ in the low concentration layer, or about $10^{16}$ to $10^{19}$ cm$^{-3}$ in the high concentration layer.

In the next step, the substrate 61 of single-crystal silicon is etched from its reverse side by the use of a chemical such as KOH with a mask of SiO$_2$ or the like formed by vapor-phase growth at a normal pressure. Since the etching speed on the [100] face of the single-crystal silicon is higher than that on the [111] face in this process, the shape obtained becomes such as shown in FIG. 6. Subsequently the surface of the single-crystal silicon substrate 61 is oxidized in a pure oxygen atmosphere at 1000° C. to form an oxide layer 64 of SiO$_2$ having a thickness of about 40 nanometers. Then aluminum is deposited thereon by resistance-heated evaporation to a thickness of about 500 nanometers, thereby producing a control electrode 65. During the time of forming the SiO₂ layer 64, an oxide film of silicon also grows on the surface of the low impurity concentration layer 63. Therefore, such oxide film is removed by chemical etching to clean the surface of the low impurity concentration layer 63. Then niobium is deposited by DC magnetron sputtering to a thickness of 300 nanometers on the surface of the low impurity concentration layer 63 thus cleaned, and the niobium film is processed by reactive ion etching while being masked with a pattern of an electron beam resist having a thickness of 350 nanometers, thereby producing first and second superconducting electrodes 66 and 67. It is desired that, in case the semiconductor material is silicon, the distance between such first and second superconducting electrodes be less than 0.2 microns. The procedure mentioned above completes a superconducting device of the present invention. The device thus produced is cooled to liquid helium temperature and placed in operation. When a negative voltage is applied to the control electrode, a positive-charge storage layer extends readily into the low impurity concentration layer 63. In this case, therefore, the superconductive coupling state between the first and second superconducting electrodes 66 and 67 can be changed by a control signal of a low voltage such as 10 mV or so, whereby the gain is increased 2.5 to 3 times as compared with the value obtained in a uniform impurity distribution. Meanwhile, when a positive voltage is applied to the control electrode, a negative-charge inversion layer hardly extends if the voltage is low, and extension of the inversion layer into the low impurity concentration layer 63 is commenced upon rise of the voltage above a certain fixed value, whereby the superconductive coupling state between the first and second superconducting electrodes 66 and 67 begins to be changed suddenly. It follows, therefore, that the superconducting device has a given threshold value (not zero) for starting the operation as compared with the case of a uniform impurity distribution and still is furnished with a remarkable function of ensuring a great gain.

Although in this embodiment the high impurity concentration layer is formed proximate to the control electrode while the low impurity concentration layer proximate to the superconducting electrodes, it is permitted to reverse the positional relationship in such a manner that the low impurity concentration layer is formed proximate to the control electrode while the high impurity concentration layer proximate to the superconducting electrodes. In such modified arrangement also, a charge inversion layer or a charge storage layer extends readily into the low impurity concentration layer in response to a low control voltage, whereby the gain is rendered great. This modification has such a feature that when the applied voltage rises above a certain given value, the inversion layer or storage layer comes to extend into the high impurity concentration layer, so that further extension of the invention layer or storage layer is hardly induced to eventually diminish the device characteristic variation. In case the impurity concentration is high on the side proximate to the superconducting electrodes, another effect is produced that both the height and width of the Schottky barrier existing in the interface between the semiconductor and the superconductor are reduced to facilitate emission of electrons from the superconducting electrodes into the semiconductor. In this case, the spatial distance between the first and second superconducting electrodes is allowed to be longer than the conventional one, hence facilitating manufacture of the device.

Embodiment 7

Figure 7:
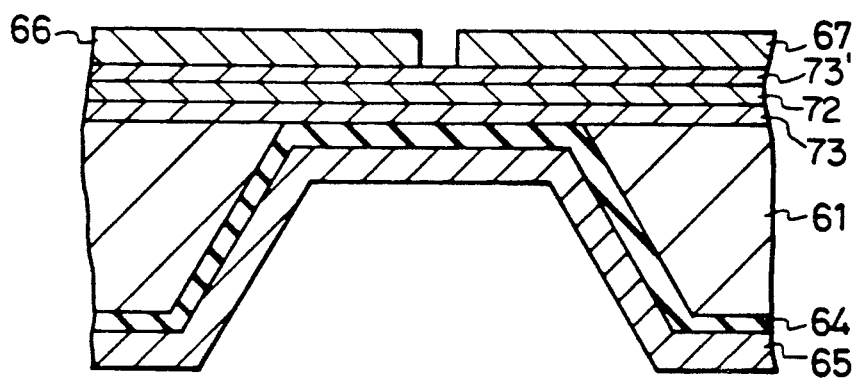
FIG. 7 is a sectional view of a seventh embodiment of the superconducting device according to the invention.

A seventh embodiment of the present invention is shown in FIG. 7, wherein a region of a low impurity concentration is located at the center of a semiconductor layer. In this arrangement, a high impurity concentration layer 73' is formed by molecular beam epitaxy or the like on a low impurity concentration layer 72 formed similarly to the aforesaid one in the embodiment of FIG. 6. Low impurity concentration layer 72 is on high impurity concentration layer 73. The seventh embodiment has a combination of the advantageous effects described in connection with the foregoing two structures (one example furnished with a high impurity concentration layer proximate to the control electrode and a low impurity concentration layer proximate to the superconducting electrodes; and another example having a reverse positional relationship thereof), whereby the gain is increased to facilitate manufacture of the device.

Embodiment 8

Figure 8:
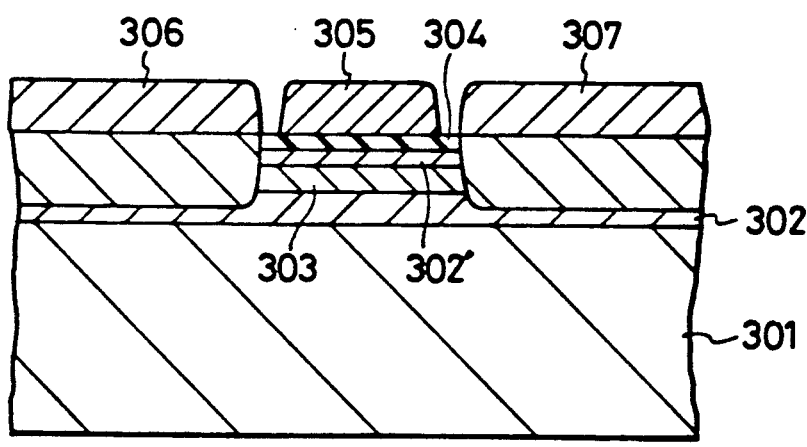
FIG. 8 is a sectional view of an eighth embodiment of the superconducting device according to the invention.

An eighth embodiment of the present invention is shown in FIG. 8, wherein a control electrode is disposed on the same side as the surface of a semiconductor layer on which superconducting electrodes are formed. On a silicon substrate 301 containing phosphorus as an impurity at a concentration of $10^{12}$ cm$^{-3}$, there are sequentially formed by molecular beam epitaxy a low impurity concentration layer 302 containing phosphorus at $10^{13}$ cm$^{-3}$, a high impurity concentration layer 303 containing phosphorus at $10^{15}$ cm$^{-3}$, and a low impurity concentration layer 302' containing phosphorus at $10^{13}$ cm$^{-3}$. Subsequently an oxide layer of SiO₂ is formed thereon at a temperature of 500° C. and, after it is shaped into a pattern, phosphorus is introduced by ion implantation with the pattern used as a mask. Then niobium is deposited on the phosphorus-diffused surface by sputtering to a thickness of about 200 nanometers, and the SiO₂ layer used as a mask is removed by etching, whereby superconducting electrodes 306 and 307 are formed. In the next step, an oxide film 304 of SiO₂ is formed by oxidation with O₂ plasma, and finally a control electrode 305 is formed by evaporation of aluminum to a thickness of 500 nanometers. In this embodiment also, a storage layer or an inversion layer readily extends into the low impurity concentration layer 302' in response to a voltage applied to the control electrode 305, so that the gain can be increased exactly as in the foregoing embodiments.

Embodiment 9

Figure 9:
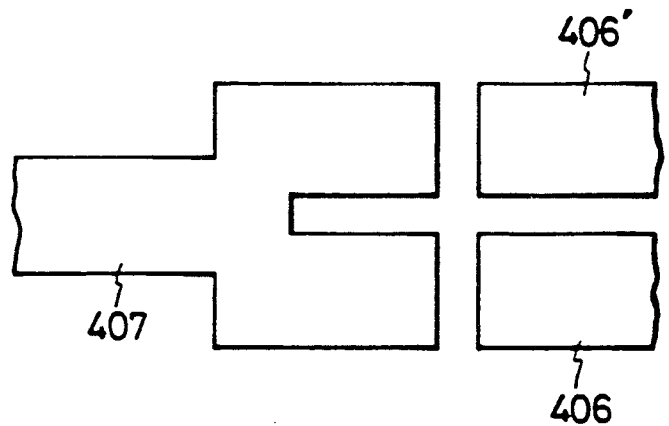
FIG. 9 is a front view of a ninth embodiment of the superconducting device according to the invention.

In the sixth through eighth embodiments mentioned hereinabove, a description has been given with regard to an arrangement including two superconducting electrodes. However, such electrodes may be three or more in number. And similar numerical modifications may be contrived with respect to the control electrode as well. For example, the effect of the present invention is attainable in an exemplary superconducting device of FIG. 9 which is equipped with three superconducting electrodes. This device is manufacturable by the same steps as those described in connection with the embodiment of FIG. 6 except formation of superconducting electrodes and the shape thereof in the processing. Designated at 406 and 406' are superconducting source electrodes, and 407 is a superconducting drain electrode. This device of a single component has an effect equivalent to a parallel connection of two components and is therefore advantageous in enhancing the integration density of the circuit.

Instead of the sixth through ninth embodiments where the impurity concentration difference is distributed throughout the layers, a low or high impurity concentration region may be formed in a limited portion of the semiconductor layer. For example, the aimed effect is attainable if a high or low impurity concentration region is limited merely to a range including a portion immediately below each of the superconducting electrodes. In another modification, the same effect is also obtainable if the impurity concentration difference is changed gradually, not stepwise. Furthermore, the semiconductor layer may be shaped insular with an impurity diffused therein in a desired distribution.

Although single-crystal silicon is employed as the semiconductor material in the above embodiments, the object of the present invention can be accomplished by the use of amorphous or polycrystal silicon as well. Silicon may be replaced with some other suitable substance such as Ge, GaAs, InAs, InP or InSb. Regarding the material for the superconducting electrodes, the aforesaid Nb is replaceable with Pb or Pb-based alloy; Nb compound such as NbN, Nb$_3$Sn, Nb$_3$Al or Nb$_3$Ge; or Mo compound such as MoN to attain the aimed effect. The material for the control electrode is not limited to Al alone, and a superconductor metal such as Pb offers the same effect. And in place of the insulator film for isolating the control electrode, a Schottky barrier may be formed as well.

Embodiment 10

A tenth embodiment of the superconducting device according to the present invention has such a feature that, for the purpose of realizing a planar structure and increasing the gain, two impurity introduced regions are formed on a semiconductor substrate to reduce the Schottky barrier, and a low impurity concentration region is formed therebetween in such a manner as to be disposed in a projection of a height which is equivalent to or smaller than the thickness of superconducting electrodes formed on the semiconductor.

Figure 10:
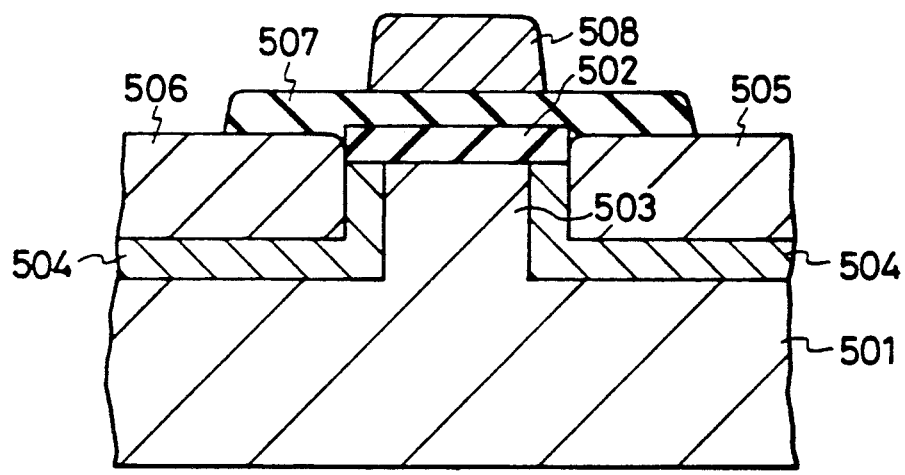
FIG. 10 is a sectional view of a tenth embodiment of the superconducting device according to the invention.

FIG. 10 is a sectional view showing principal portions of the tenth exemplary superconducting device embodying the present invention. The surface of a silicon substrate 501 containing boron as an impurity at a concentration of $1 \times 10^{14}$ cm$^{-3}$ or less is oxidized to form thereon an oxide film 502 of SiO$_2$ to a thickness of 30 nanometers and, after a photoresist pattern is formed thereon to be used as a mask, the surface of the silicon substrate is processed by plasma etching with CF$_4$ gas or by ion beam etching with Ar or CF$_4$ gas, thereby forming a projection 503. It is desired that the height of the projection 503, which corresponds to the amount of the silicon substrate removed by etching, should be equivalent to or smaller than the thickness of superconducting electrodes to be formed later. In this embodiment, such height is selected to be 200 nanometers. And a desirable width of the projection 503 ranges from 0.3 to 0.1 micron. Subsequently, boron is diffused throughout the entire surface of the sample at a surface concentration of $1 \times 10^{19}$ cm$^{-3}$ to form a diffusion layer 504. The process of diffusion may be replaced with ion implantation in forming the layer 504 to accomplish the object of this embodiment. An exemplary thickness of the diffusion layer is selected to be 50 nanometers from the surface. Such diffusion layers are formed on the two sides of the projection 503 while a low impurity concentration region is left at the center. In the next step, niobium is evaporated by electron beam heating in a high vacuum receptacle at $1 \times 10^{-6}$ Pa or less, whereby a niobium film is deposited to a thickness of about 200 nanometers. For deposition of such niobium film, sputtering is also applicable in place of electron beam evaporation. With a photoresist pattern used as a mask, the niobium film is processed by plasma etching with CF$_4$ gas to produce superconducting electrodes 505 and 506. The projection 503 and the superconducting electrodes 505 and 506 are existent substantially at the same height to realize the aim of flattening the device to a planar structure. Subsequently an oxide film of SiO$_2$ is formed by vapor phase growth to a thickness of 50 nanometers and then is processed by plasma etching to form an insulator film 507. And in the final step, a niobium film is formed by vacuum evaporation and is processed by plasma etching to produce a control electrode 508, hence completing the superconducting device of the present invention. In forming the SiO$_2$ film, the aforesaid vapor phase growth is replaceable with sputtering.

An integrated circuit manufactured by the use of such superconducting device is cooled to the temperature (4.2 K) of liquid helium and is placed in operation. Then emission of superconducting electrons into the semiconductor is expedited due to that the impurity concentration in a region corresponding to the channel is as low as $1 \times 10^{14}$ cm$^{-3}$ in this superconducting device and also that the diffusion layer is existent in a portion of the semiconductor adjacent to the superconductor. And the coherent length in the semiconductor is changed by a voltage of several millivolts applied to the control electrode, whereby the current flowing between the two superconducting electrodes is variable 10 to 100 times. Furthermore, since the device is planar in shape as mentioned, wiring on the control electrode and lead layers for connection thereof can be arrayed in a multilayer arrangement three-dimensionally to realize high density integration and an enhanced yield rate in manufacture. In this embodiment where the oxide film 502 is previously formed to produce a gate insulator film, the interface level can be lowered to stabilize the device operation. It is a matter of course that silicon used for the semiconductor is replaceable with some other suitable substance such as GaAs, InAs, InP or InSb. Also the same effect is achievable if niobium used for the superconducting electrodes is replaced with Pb alloy; Nb compound such as NbN, Nb$_3$Si, Nb$_3$Al or Nb$_3$Sn; or Mo compound such as MoN. As for the impurity, boron may be replaced with phosphorus, arsenic or antimony.

Although it is preferred to employ an impurity of the same conduction type as that of the substrate, an impurity of a different conduction type is also usable to attain the aimed effect of the invention.

What is claimed is:

1. A superconducting device comprising: a semiconductor layer having two opposed main surfaces; at least two superconducting electrodes formed in contact with said semiconductor layer, on one of the main surfaces of the semiconductor layer; and at least one control electrode means for controlling current flowing between said superconducting electrodes, said at least one control electrode means being formed on said semiconductor layer between said superconducting electrodes and separated from said semiconductor layer by an electrically insulating film having a thickness of 20 to 80 nanometers, said at least one control electrode means being on the other side of the main surface of the semiconductor layer, whereby the semiconductor layer is positioned between the at least one control electrode means and the at least two superconducting electrodes; with an impurity contained in said semiconductor layer being so distributed as to form at least one high impurity concentration region having a concentration above a mean value and at least one low impurity concentration region having a concentration below said mean value.

2. The superconducting device as defined in claim 1, wherein said high impurity concentration region is existent proximate to said control electrode means.

3. The superconducting device as defined in claim 1, wherein said high impurity concentration region is existent in contact with said superconducting electrodes.

4. The superconducting device as defined in claim 1, wherein said high impurity concentration region consists of a portion existent proximate to said control electrode and a portion existent in contact with said superconducting electrodes.

5. The superconducting device as defined in claim 1, further comprising means for applying a voltage to the control electrode means so as to induce a charge in the semiconductor to thereby control the superconductive weak coupling state between the superconducting electrodes.

6. The superconducting device as defined in claim 3, further comprising means for applying a voltage to the control electrode means so as to induce a charge in the semiconductor layer to thereby control the superconductive weak coupling state between the superconducting electrodes.

7. The superconducting device as defined in claim 4, wherein at least one of the at least one low impurity concentration regions is sandwiched between the portion of the high impurity concentration region proximate to said control electrode means and the portion of the high impurity concentration region in contact with the superconducting electrodes.

8. The superconducting device as defined in claim 1, wherein a distance between the pair of superconducting electrodes is at most 0.5 microns.

9. The superconducting device as defined in claim 1, wherein said semiconductor layer has relatively thick and relatively thin portions, wherein the at least one control electrode means is on the other of the main surfaces of the semiconductor layer at a relatively thin portion, and wherein the space between the superconducting electrodes is over the one of the main surfaces of the semiconductor layer at the relatively thin portion, at a location opposed to the at least one control electrode means.

10. The superconducting device as defined in claim 9, wherein said high impurity concentration region is existent proximate to said control electrode means.

11. The superconducting device as defined in claim 9, wherein said high impurity concentration region is existent in contact with said superconducting electrodes.

12. The superconducting device as defined in claim 9, wherein said high impurity concentration region consists of a portion existent proximate to said control electrode means and a portion existent in contact with said superconducting electrodes.

13. The superconducting device as defined in claim 12, wherein at least one of the at least one low impurity concentration regions is sandwiched between the portion of the high impurity concentration region proximate to said control electrode means and the portion of the high impurity concentration region in contact with the superconducting electrodes.

14. The superconducting device as defined in claim 1, wherein each of the high impurity concentration region and the low impurity concentration region are of the same conductivity type.

15. The superconducting device as defined in claim 1, wherein the impurity distributed so as to form the high impurity concentration region and the low impurity concentration region is the same impurity in each.

16. The superconducting device as defined in claim 1, wherein said semiconductor layer includes a stack of semiconductor regions, the stack of semiconductor regions including first and second low impurity concentration regions sandwiching a high impurity concentration region, the first low impurity concentration region being existent proximate to the control electrode means.

17. A superconducting device comprising a pair of superconducting electrodes so formed as to extend adjacent semiconductor material to have the semiconductor material interposed between the pair of superconducting electrodes, the pair of superconducting electrodes extending adjacent a first principal surface of the semiconductor material, and a control electrode means for controlling current flowing between the pair of superconducting electrodes, the control electrode means being adjacent a second principal surface of the semiconductor material with an insulating film between the semiconductor material and control electrode means, the second principal surface being opposite to the first principal surface, the insulating film having a thickness of 20 to 80 nanometers, said control electrode means serving to control the superconducting weak coupling state between said superconducting electrodes, wherein a projection of the semiconductor material is interposed between the pair of superconducting electrodes, the semiconductor material is a layer of semiconductor material on a substrate, the control electrode means being interposed between the substrate and the layer of semiconductor material.

18. A superconducting device as defined in claim 17, wherein said substrate is a semiconductor substrate.

19. A superconducting device as defined in claim 18, wherein the layer of semiconductor material is a layer of polycrystalline or amorphous silicon.

20. A superconducting integrate circuit device comprising a pair of superconducting electrodes so formed as to extend adjacent semiconductor material and to have the semiconductor material interposed between the pair of superconducting electrodes, the pair of superconducting electrodes extending adjacent a first principal surface of the semiconductor material, and a control electrode means for controlling current flowing between the pair of superconducting electrodes, the control electrode means being adjacent a second principal surface of the semiconductor material with an insulating film between the semiconductor material and control electrode means, the second principal surface being opposite to the first principal surface, the insulating film having a thickness of 20 to 80 nanometers, said control electrode means serving to control the superconducting weak coupling state between said superconducting electrodes and at least one further component element, provided on a single substrate.

21. A superconducting integrated circuit device as defined in claim 20, wherein the integrated circuit device further includes a wiring layer provided on the single substrate.

22. A superconductivity integrated circuit device as defined in claim 21, wherein said wiring layer is provided on the substrate, with an insulating layer thereover, and wherein said pair of superconducting electrodes and said semiconductor material of said superconducting device are provided over the insulating layer.

23. A superconducting integrated circuit device as defined in claim 22, wherein said insulating layer provides said insulating film between said semiconductor material and said control electrode means.

24. A superconducting integrated circuit device as defined in claim 23, wherein one of the pair of superconducting electrodes is electrically connected to a first one of said at least one further component element.

25. A superconducting integrated circuit device as defined in claim 24, wherein the control electrode means is electrically connected to a second one of said at least one further component element.

26. A superconducting device comprising a pair of superconducting electrodes so formed as to extend adjacent semiconductor material and to have the semiconductor material interposed between the pair of superconducting electrodes, the pair of superconducting electrodes extending adjacent a first principal surface of the semiconductor material, and a control electrode means for controlling current flowing between the pair of superconducting electrodes, the control electrode means being adjacent a second principal surface of the semiconductor material with an insulating film between the semiconductor material and control electrode means, the second principal surface being opposite to the first principal surface, the insulating film having a thickness of 20 to 80 nanometers, said control electrode means serving to control the superconducting weak coupling state between said superconducting electrodes, wherein said semiconductor material includes a region having a relatively low impurity concentration as compared to the impurity concentration in another region of said semiconductor material and wherein said region having a relatively low impurity concentration is existent proximate to the control electrode means.

* * * * *